United States Patent [19]
Saegusa

[11] Patent Number: 5,517,512
[45] Date of Patent: May 14, 1996

[54] CYCLIC CODING AND CYCLIC REDUNDANCY CODE CHECK PROCESSOR

[75] Inventor: Yasuhiro Saegusa, Tokyo, Japan

[73] Assignee: NEC Corporation, Tokyo, Japan

[21] Appl. No.: 186,154

[22] Filed: Jan. 25, 1994

[30]   Foreign Application Priority Data

Jan. 25, 1993   [JP]   Japan ..................................... 5-009636

[51] Int. Cl.⁶ ................................................. H03M 13/00
[52] U.S. Cl. ......................................... 371/37.8; 371/37.1
[58] Field of Search ................................... 371/37.8, 37.1, 371/38.1, 39.1, 40.1, 377; 360/49

[56]   References Cited

U.S. PATENT DOCUMENTS

| | | | |
|---|---|---|---|
| 4,964,129 | 10/1990 | Bowden, III et al. | 371/40.2 |
| 5,099,484 | 5/1992 | Smelser | 371/38.1 |
| 5,359,468 | 10/1996 | Rhodes et al. | 360/48 |

Primary Examiner—Roy N. Envall, Jr.
Assistant Examiner—Emmanuel L. Moise
Attorney, Agent, or Firm—Foley & Lardner

[57]   ABSTRACT

A cyclic coding and cyclic redundancy check processor for a generator polynomial G(X) with a degree of m (m is an integer satisfying m≦n/2) by units of n bits comprising a residue table storage section to store a residue table containing $2^n$ pieces of residue data each having n/2 bits obtained by divisions of $2^n$ pieces of data having n bits by the generator polynomial, a data read section to read out the data having predetermined number of bits for cyclic coding by units of n bits, an address generation section to generate addresses of the residue data to be read out from the residue table storage section, a residue data read section to read the residue data out of the residue table storage section according to the generated address, a processing section for shifting and saving of the data subjected to cyclic coding and a data synthesis section for synthesis of the data shifted or saved and the read out residue data.

11 Claims, 13 Drawing Sheets

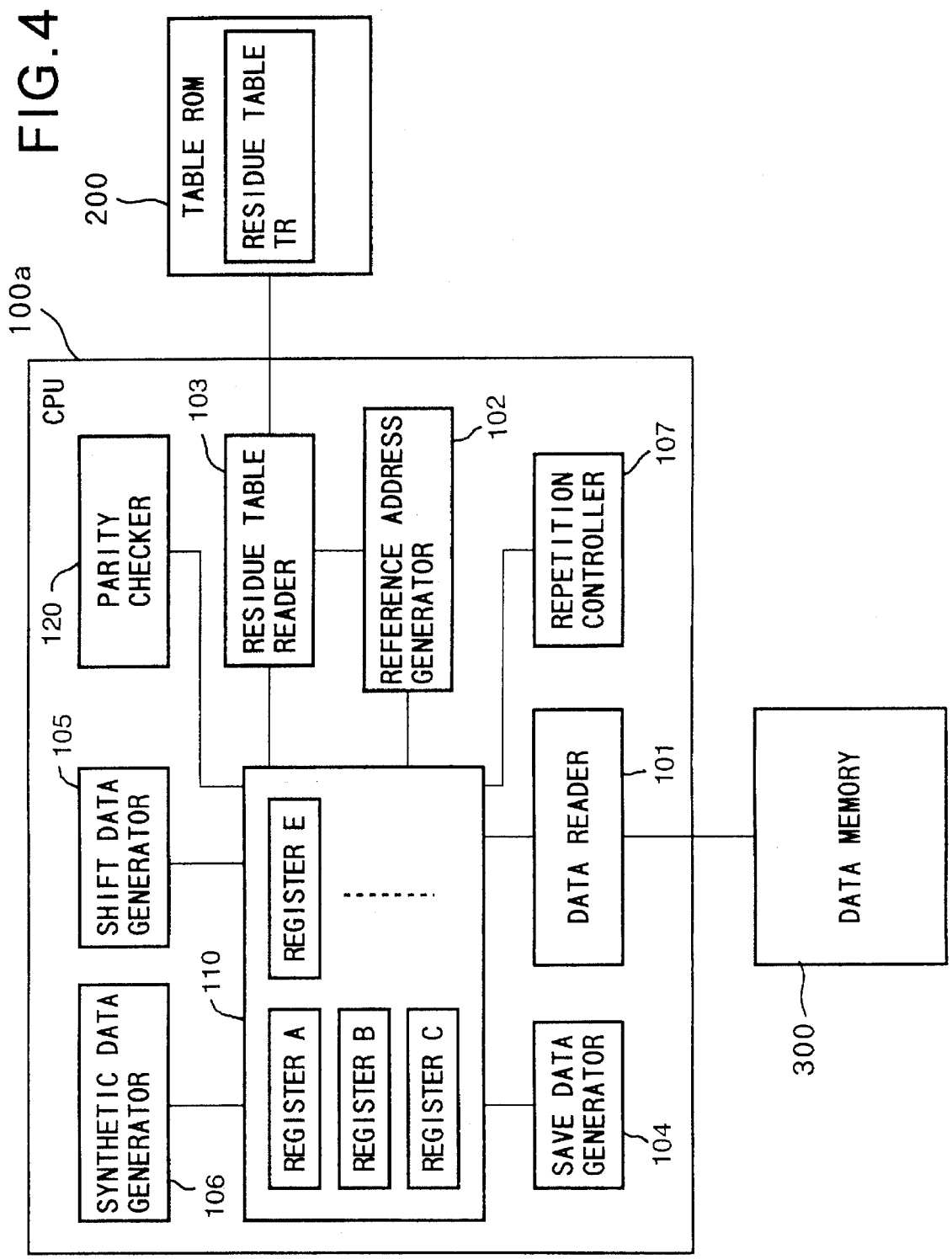

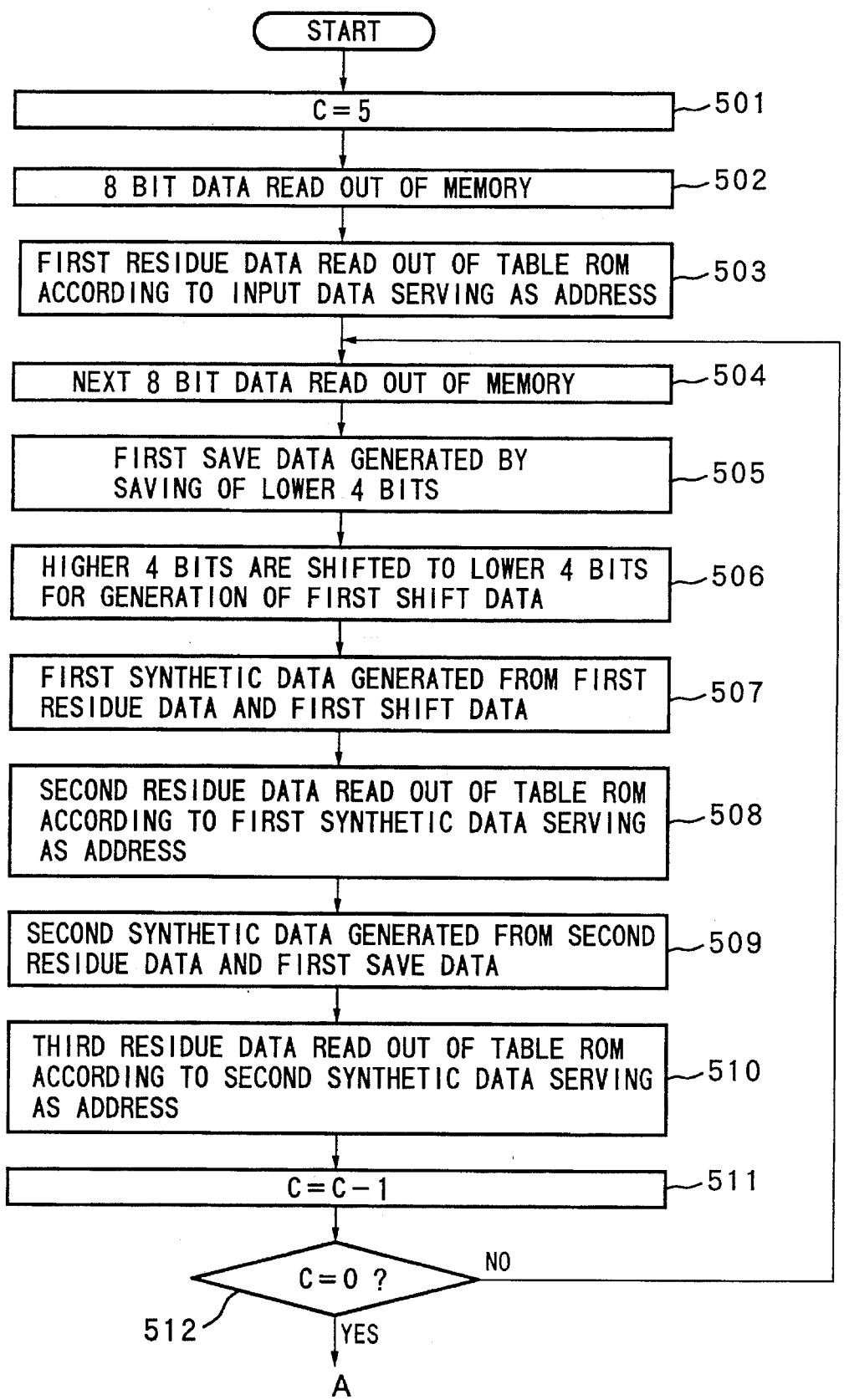

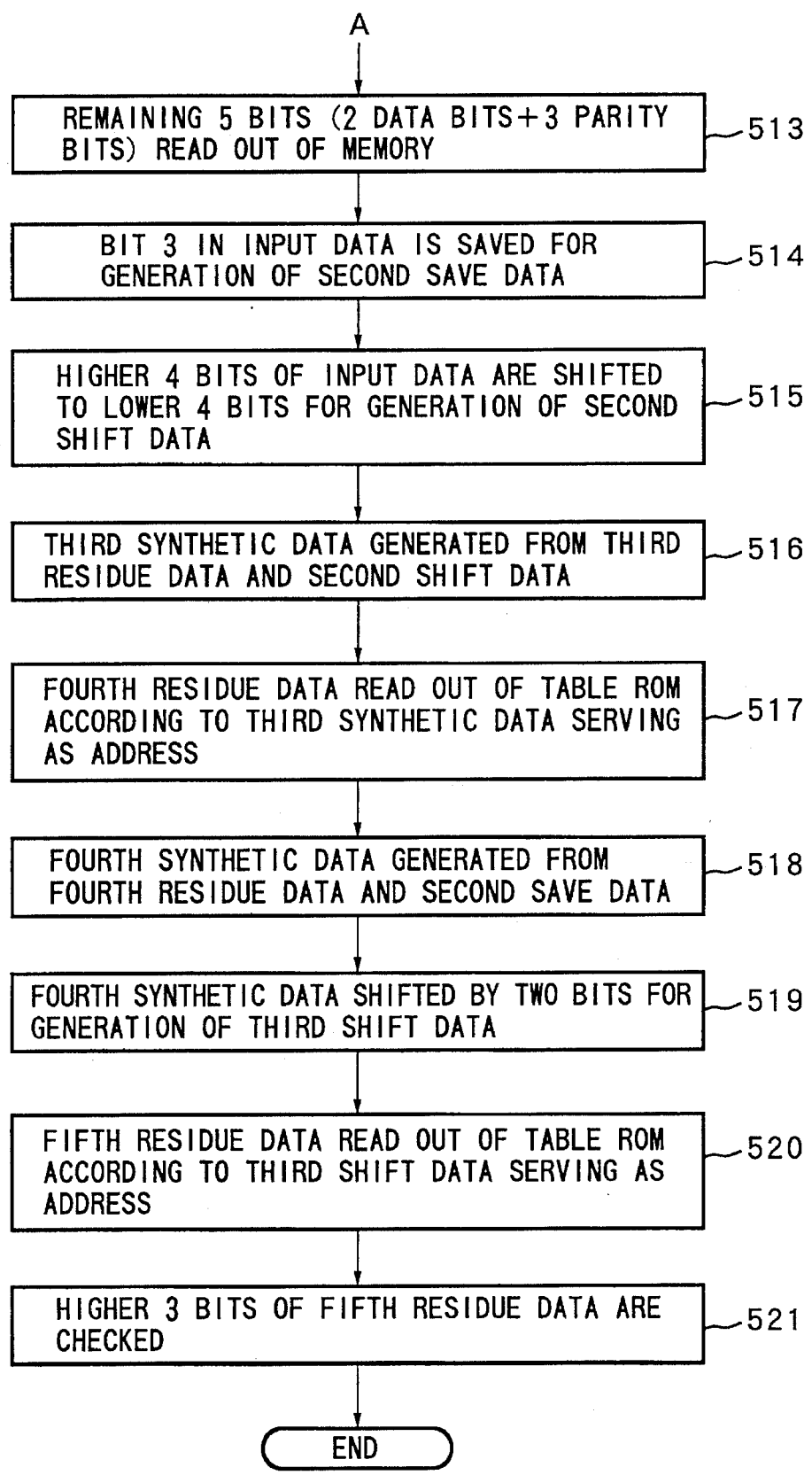

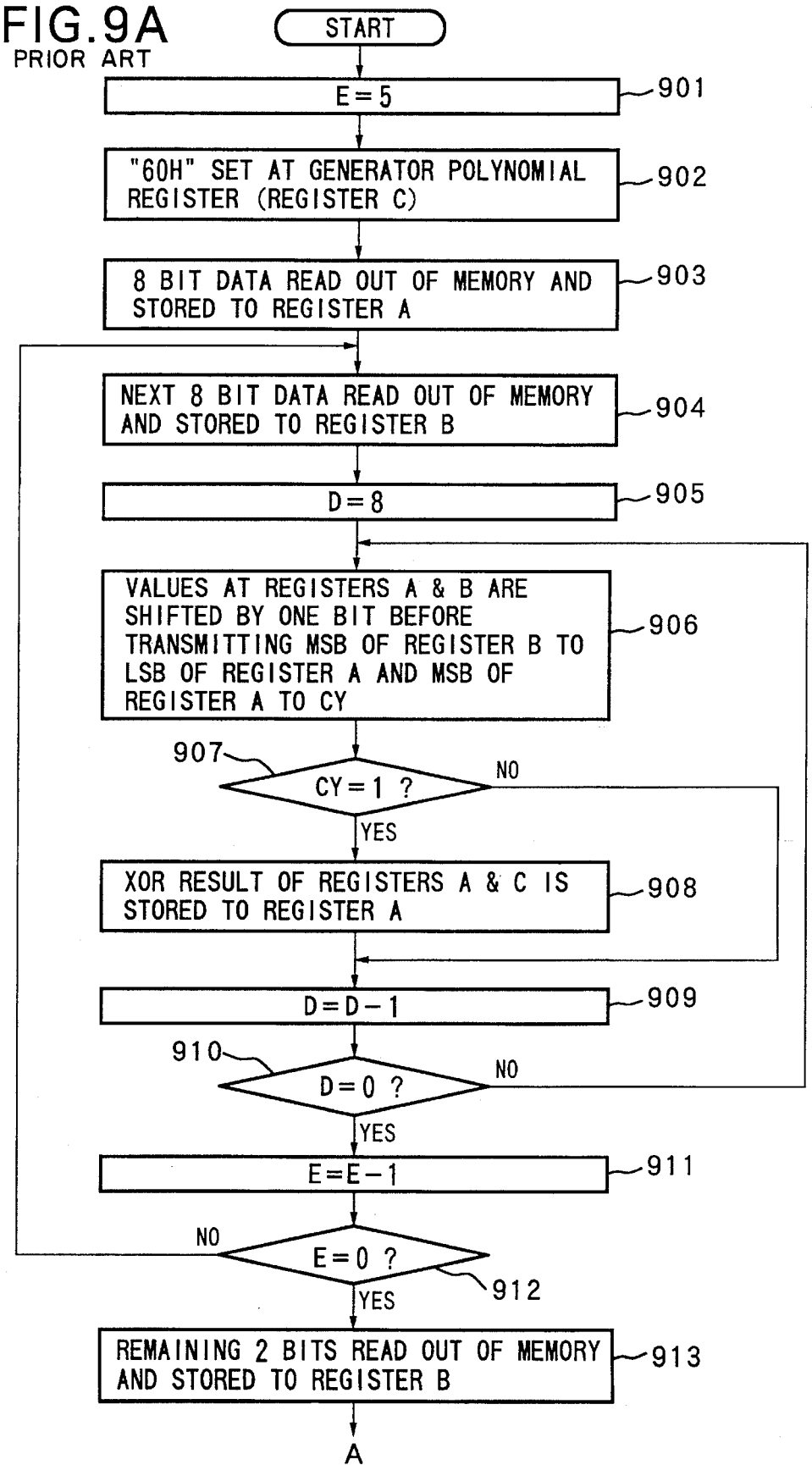

CYCLIC CODING AND CYCLIC REDUNDANCY CODE CHECK PROCESSOR

BACKGROUNDS OF THE INVENTION

1. Field of the Invention

The present invention relates to a processor for cyclic coding and cyclic redundancy code check (hereinafter referred to as "CRC"), and particularly relates to a cyclic coding and CRC processor for error detection and correction of the data received in digital communications.

2. Description of the Related Art

Error detection and error correction are techniques used at the receiver to accurately receive the data from the transmitter in digital signal communications. Cyclic coding is a process to generate check bits at the transmitter to facilitate such error detection or error correction at the receiver. It may be used for both error detection and error correction corresponding to the type of generator polynomial and available devices at the receiver.

On the other hand, CRC is a process carried out at the receiver to detect errors in the cyclic coded data as described above. Conventionally, there have been two types of cyclic coding and CRC processor for computerized cyclic coding and CRC corresponding to the degree of the generator polynomial and the number of data bits subjected to cyclic coding. Since the cyclic coding and CRC basically have the same procedure, the following description mainly addresses the cyclic coding.

First of all, the type of the computer, the degree of the generator polynomial and the number of data bits subjected to cyclic coding are defined. Suppose that the computer is an 8 bit microcomputer, the generator polynomial is $G(X)=X^3+X+1$, and the number of data subjected to cyclic coding is 50 bits. The 50 bit data for cyclic coding are $a_{49}, a_{48}, \ldots a_1$ and $a_0$, where $a_{49}$ is the the most significant bit (MSB).

A cyclic coding and CRC processor in a first conventional example is effective only when the generator polynomial has a low degree and a small number of data bits are processed. As shown in FIG. 6, it comprises a central processing unit (CPU) 600 for operation, data processing and control with a unit of 8 bits, a data memory 620 which stores 50 bits of the data for cyclic coding in order and a table ROM 610 which stores a syndrome table, all of which are connected with a bus 630.

The table ROM 610 stores a syndrome table prepared in advance. For the syndrome table, data polynomials $Ai(X)= ai\cdot X^i$ for the data which have 50 bits $\{a_{49}, \ldots a_0\}$ and whose bits are all "0" except for bit i which is a "1" (i is an integer satisfying $0 \leq i \leq 49$) (there exists 50 pieces of such data) are multiplied by $X^3$ and the products are divided by $G(X)$ with modulo 2. The remainders (=3 bits) of such divisions are stored in the table. The syndrome table substantially has a size of 3 bits×50 (50 bytes for a memory of 8 bit units).

Next, refer to the flowcharts of FIGS. 7A and 7B illustrating the processing procedure and Table 1 showing an example of coding with a Z80 assembler.

Firstly, the CPU 600 sets the number of loops C to be 6 (Step 701). Next, it clears the parity register (one of the general purpose registers) inside (Step 702). Then, in Steps 703 to 706, the CPU 600 reads out 8 bit data ($a_n$ to $a_{n-7}$ with a n being the MSB; first n=49) from the data memory 620 (input data), shifts the data by one bit and then transmits the MSB to the CY (carry register).

In Step 707, it is judged whether CY=1 or not. If CY is 1, the syndrome value for the hit data an (First n=49) from the table ROM 610 (the lower 3 bits are valid in the 8 bit data (Step 708). Then, the syndrome value and the value at the above parity register are XORed and the result is stored to the above parity register (Step 709).

If CY=0 in Step 707, nothing is performed for it. The CPU 600 performs such bit judgment processing for the remaining bits ($a_{n-1}$ to $a_{n-7}$; n=49) (Steps 710 to 711).

When the processing is completed for all of 8 bits (Step 712), the CPU reads out the next 8 bit data ($a_n$ to $a_{n-7}$, n=41) out of the data memory 620 and follows Steps 706 to 712. Then, the CPU 600 performs Steps 704 to 714 for the number of loops (for 48 bits).

Then, in Steps 715 to 721, the remaining two bits are also subjected to the same bit judgment. The lower 3 bits which remain in the above parity register in Steps 722 to 724 are used as the parity bits.

[TABLE 1]

```
******
Cyclic coding (Parity generation) -- Syndrome table
method --
        Generator polynomial: G(X) = X³ + X + 1
        Data: D[49]-D[0] (50 bits)
        LD    DE, DATA        ;DE: Input data address
        LD    HL, SYNDROME    ;HL: Syndrome table address
        LD    C, 6            ;C: Number of loops
        LD    A, 0            ;A: Parity register clear
        EX    AF, AF'
LOOP1:  LD    A, (DE)         ;A: Input data (8 bits)
        LD    B, 8            ;B: Number of loops
LOOP2:  SLA   A               ;MSB - CY
        JR    NC, LOOP3       ;Syndrome operation if CY = 1
        EX    AF, AF'
        XOR   (HL)            ;A ← A XOR (syndrome for D[n])
        EX    AF, AF'
LOOP3:  INC   L               ;Next syndrome table address
        DEC   B
        JP    NZ, LOOP2
        INC   E               ;Next input data address
        DEC   C
        JP    NZ, LOOP1
        LD    A,(DE)          ;A: Input data (2 bits)
        SLA   A               ;MSB → CY
```

[TABLE 1]-continued

```
          JR    NC, LOOP4     ;Syndrome operation if CY = 1
          EX    AF, AF'
          XOR   (HL)          ;A ← A XOR (syndrome for D[1])
          EX    AF, AF'
LOOP4:    INC   L             ;Next syndrome table address
          SLA   A             ;MSB → CY
          JR    NC, LOOP5     ;Syndrome operation if CY = 1
          EX    AF, AF'
          XOR   (HL)          ;A ← A XOR (syndrome for D[0])
LOOP5:
;         SYNDROME TABLE
SYNDROME:
          DB    Syndrome for D[49]
          DB    Syndrome for D[48]
          .
          .
          .
          DB    Syndrome for D[0]
```

From the coding example of Table 1, the number of execution states for the first conventional example is calculated to be a value from at least 1855 states to at most 2851 states, depending on whether the data is 1 or 0.

Next, according to a second conventional example, cyclic coding can be made substantially for any number of data bits, provided that the degree of the generator polynomial is not more than twice the number of bits in the applicable general-purpose register. As shown in FIG. 8, a processor according to the present invention comprises a CPU 800 and a data memory 820, which are connected with a bus 830 each other, similarly to the first example.

Referring now to the flowcharts of FIGS. 9A and 9B and a coding example using Z80 assembler in Table 2, the CPU 800 first sets the number of loops E to be 5 (Step 901). Next, it sets the generator polynomial registers (two of the general-purpose registers) in the CPU 800 to have 60H (Step 902). Then, in Step 903, the CPU 800 reads out 8 bit data ($a_{49}$ to $a_{42}$, with $a_{49}$ being the MSB) from the data memory 820 and stores the data to register A (one of the general-purpose registers) inside. In Step 904, the CPU 800 reads out the next 8 bit data ($a_n$ to $a_{n-7}$, with a n being the MSB; n=41) from the data memory 820 and stores the data to register B (one of the general-purpose registers) inside.

The above procedure is performed for 8 bits (Step 905). Then, in Step 906, the values of registers A and B are shifted by one bit and the MSB of register B is transmitted to the least significant bit (LSB) of register A and the MSB of register A to the carry register (CY). In Step 907, it is judged whether CY=1 or not. If CY is 1, the values of register A and generator polynomial register are XORed and the result is stored to register A (Step 908). If CY is 0 in Step 907, then the CPU 800 just proceeds to Step 909. Then, the CPU 800 performs such bit judgment processing for the remaining 7 bits ($a_{48}$ to $a_{42}$) firstly stored to register A (Steps 906 to 910). At this time, the data of register B ($a_n$ to $a_{n-7}$; n=41) are entirely shifted to register A, and the CPU 800 reads out the following 8 bit data ($a_n$ to $a_{n-7}$; n=33) from the data memory 820, stores the data to register B and follows Steps 906 to 910. The CPU 800 performs the procedure of Steps 904 to 910 for the number of loops (for 48 bits). Then, in Steps 913 to 919, it performs similar bit judgment for the remaining 2 bits. The higher 3 bits of the value at register A upon completion of processing are the parity bits (Step 920).

[TABLE 2]

```
******
Cyclic coding (parity generation) -- Shift operation method
          Generator polynomial: G(X) = X³ + X + 1
          data : D[49]-D[0] (50 bits)
******
          LD    HL, DATA      ;HL: Input data address
          LD    C, 60H        ;C: Generator polynomial register
          LD    E, 5          ;E: Number of loops
          LD    A, (HL)       ;A: Input data
LOOP1:    INC   L             ;HL: Next input data address
          LD    B, (HL)       ;B: Next input data
          LD    D, 8
LOOP2:    RL    B             ;One bit shifting to the left
                              for registers A & B
          RL    A             ;Register B MSB → Register A LSB
                              ;Register A MSB → CY
          JR    NC, LOOP3     ;Operation if CY = 1
          XOR   C
LOOP3:    DEC   D
          JP    NZ, LOOP2
          DEC   E
          JP    NZ, LOOP1
          INC   L
```

[TABLE 2]-continued

|  | LD | B,(HL) | ;B: Remaining data input (Higher 2 bits are valid) |
|---|---|---|---|
|  | LD | D, 10 |  |
| LOOP4: | RL | B | ;One bit shifting to the left for registers A & B |
|  | RL | A | ;Register B MSB → Register A LSB ;Register A MSB → CY |
|  | JR | NC, LOOP5 | ;Operation if CY = 1 |
|  | XOR | C |  |
| LOOP5: | DEC | D |  |
|  | JP | NZ, LOOP4 |  |

From the coding example of Table 2, the number of execution states for the second conventional example is calculated to be a value from 1727 to 2095, depending on whether the data is 1 or 0.

The conventional cyclic coding and CRC processor as described above involves complicated and lengthy processing including judgment process and XOR operation for each bit of data. This limits the time available for other processing such as communication protocol control, and naturally results in an increased cost when a high speed computer is used to reduce time for such processing.

SUMMARY OF THE INVENTION

It is an object of the present invention to provide a cyclic coding and cyclic redundancy check processor which reduces the time required for cyclic coding and CRC and thereby enables effective utilization of computer capacity for other processing such as communication protocol control.

It is another object of the present invention to provide a cyclic coding and cyclic redundancy check processor which reduces the processing time for cyclic coding and CRC to eliminate the need of high speed computer and to thereby reduce the cost of the entire system.

According to a preferred embodiment of the present invention to attain the above objects, a cyclic coding processor for a generator polynomial G(X) with a degree of m (m is an integer satisfying m=n/2) using a computer for data processing by units of n bits comprises residue table storage means which stores a residue table containing $2^n$ pieces of residue data having n/2 bits obtained by divisions of $2^n$ pieces of data having n bits by the generator polynomial, data read means which reads out the data having predetermined number of bits for cyclic coding by units of n bits, address generation means which generates addresses of the residue data to be read out from the residue table storage means, residue data read means which reads the residue data out of the residue table storage means according to the generated address, data save means which saves the data subjected to the cyclic coding, data shift means which shifts the data subjected to the cyclic coding and data synthesis means to synthesize the shifted and saved data and the residue data read out.

According to a further preferred embodiment of a cyclic coding processor, the data save means generates save data by saving the lower n/2 bits of the data subjected to cyclic coding, the data shift means generates the shift data by shifting the higher n/2 bits of the data subjected to the cyclic coding toward the lower n/2 bits, and the data synthesis means generates synthetic data by synthesizing the residue data and the shift data or the residue data and the save data.

According to another preferred embodiment of a cyclic coding processor, the address generation means uses, for the first address generation, n bit data subjected to cyclic coding read out by the data read means in order to generate the address for the residue table, and for the following address generations, the data obtained by synthesis of the residue data having n/2 bits previously read out and n/2 bits among the n bits subjected to the cyclic coding in order to generate the address for the residue table.

According to a still preferred embodiment of a cyclic coding processor, the address generation means uses, for the first and following address generation processes, the data obtained by synthesis with treating the residue data of n/2 bits previously read out as the higher bits and n/2 bits of the n bits subjected to the cyclic coding as the lower bits in order to generate the address for the residue table.

According to a further preferred embodiment of a cyclic coding processor, the residue table has $2^n$ pieces of residue data each having a length of n/2 bits obtained by modulo 2 divisions with the generator polynomial G (X) of the data polynomials $$Da(X) = \sum_{i=n/2-m}^{n-1} d_i X^i$$

for $2^n$ pieces of data with groups of n bits {Dk} (Dk=($d_0$, ..., $d_i$, ..., $d_{n-1}$) where di is 0 or 1, i is an integer satisfying $0 \leq i \leq n-1$ and k is an integer satisfying $0 \leq k \leq 2^n$.

According to still another preferred embodiment of a cyclic coding processor, the residue table has, if n/2−m=0, $2^n$ pieces of residue data {$r_0$, ..., $r_{m-1}$}, each having a length of n/2 bits, obtained by modulo 2 divisions with the generator polynomial G(X) of the data polynomials $$Da(X) = \sum_{i=n/2-m}^{n-1} d_i X^i$$

for the data {Dk} and, if n/2−m>0, n/2 bit data comprising $2^n$ pieces of m bit residue data {$r_0$, ..., $r_{m-1}$} obtained by modulo 2 divisions with the generator polynomial G(X) of the data polynomials and the remaining n/2−m bit data of the data {Dk}, which are {$d_0$, ..., $d_{n/2-m+1}$}.

According to another preferred embodiment to attain the above objects, a cyclic redundancy check processor for a generator polynomial G(X) with a degree of m (m is an integer satisfying $m \leq n/2$) using a computer for data processing by units of n bits comprises residue table storage means which stores a residue table containing $2^n$ pieces of residue data having n/2 bits obtained by division of $2^n$ pieces of data having n bits by the generator polynomial, data read means which reads out the data having predetermined number of bits for cyclic redundancy check by units of n bits, address generation means which generates addresses of the residue data to be read out from the residue table storage means, residue data read means which reads the residue data out of the residue table storage means according to the generated address, data save means which saves the data subjected to the cyclic redundancy check, data shift means which shifts the data subjected to the cyclic redundancy check, data synthesis means to synthesize the shifted and saved data and the residue data read out and check means for parity check of the data subjected to the cyclic redundancy checking using the residue data finally read out.

According to a further preferred embodiment of a cyclic redundancy check processor, the data save means generates save data by saving the lower n/2 bits of the data subjected to cyclic redundancy check, the data shift means generates the shift data by shifting the higher n/2 bits of the data subjected to the cyclic redundancy check toward the lower n/2 bits, and the data synthesis means generates synthetic data by synthesizing the residue data and the shift data or the residue data and the save data.

According to another preferred embodiment of a cyclic redundancy check processor, the address generation means uses, for the first address generation, n bit data subjected to cyclic redundancy check read out by the data read means in order to generate the address for the residue table, and for the following address generations, the data obtained by synthesis of the residue data having n/2 bits previously read out and n/2 bits among the n bits subjected to the cyclic redundancy check in order to generate the address for the residue table.

According to still another preferred embodiment of a cyclic redundancy check processor, the address generation means uses, for the first and following address generation processes, the data obtained by synthesis with treating the residue data of n/2 bits previously read out as the higher bits and n/2 bits of the n bits subjected to the cyclic redundancy check as the lower bits in order to generate the address for the residue table.

According to a further preferred embodiment of a cyclic redundancy check processor, the residue table has $2^n$ pieces of residue data each having a length of n/2 bits obtained by modulo 2 divisions with the generator polynomial G (X) of the data polynomials $$Da(X) = \sum_{i=n/2-m}^{n-1} d_i X^i$$

for $2^n$ pieces of data with groups of n bits {Dk} (Dk=($d_0$, . . . ,$d_i$, . . . , $d_{n-1}$) where di is 0 or 1, i is an integer satisfying $0 \leq i \leq n-1$ and k is an integer satisfying $0 \leq k \leq 2^n$.

According to still another preferred embodiment of a cyclic redundancy check processor, the residue table has, if n/2−m=0, $2^n$ pieces of residue data {$r_0$, . . . , $r_{m-1}$}, each having a length of n/2 bits, obtained by modulo 2 divisions with the generator polynomial G(X) of the data polynomials $$Da(X) = \sum_{i=n/2-m}^{n-1} d_i X^i$$

for the data {Dk} and, if n/2−m<0, n/2 bit data comprising $2^n$ pieces of m bit residue data {$r_0$, . . . , $r_{m-1}$} obtained by modulo 2 divisions with the generator polynomial G(X) of the data polynomials and the remaining n/2−m bit data of the data {Dk}, which are {$d_0$, . . . , $d_{n/2-m+1}$}.

Other objects, features and advantages of the present invention will become clear from the detailed description given herebelow.

BRIEF DESCRIPTION OF THE DRAWINGS

The present invention will be understood more fully from the detailed description given herebelow and from the accompanying drawings of the preferred embodiment of the invention, which, however, should not be taken to be limitative to the invention, but are for explanation and understanding only.

In the drawings:

FIG. 4 is a block diagram to illustrate the configuration of a CRC processor according to a second embodiment of the present invention;

FIGS. 5A and 5B show flowcharts illustrating the flow of CRC processing according to the second embodiment;

FIGS. 9A and 9B show flowcharts illustrating the flow of conventional cyclic coding.

DESCRIPTION OF THE PREFERRED EMBODIMENT

Referring to the attached figures, preferred embodiments of the present invention will be described in detail below.

Figure 3:
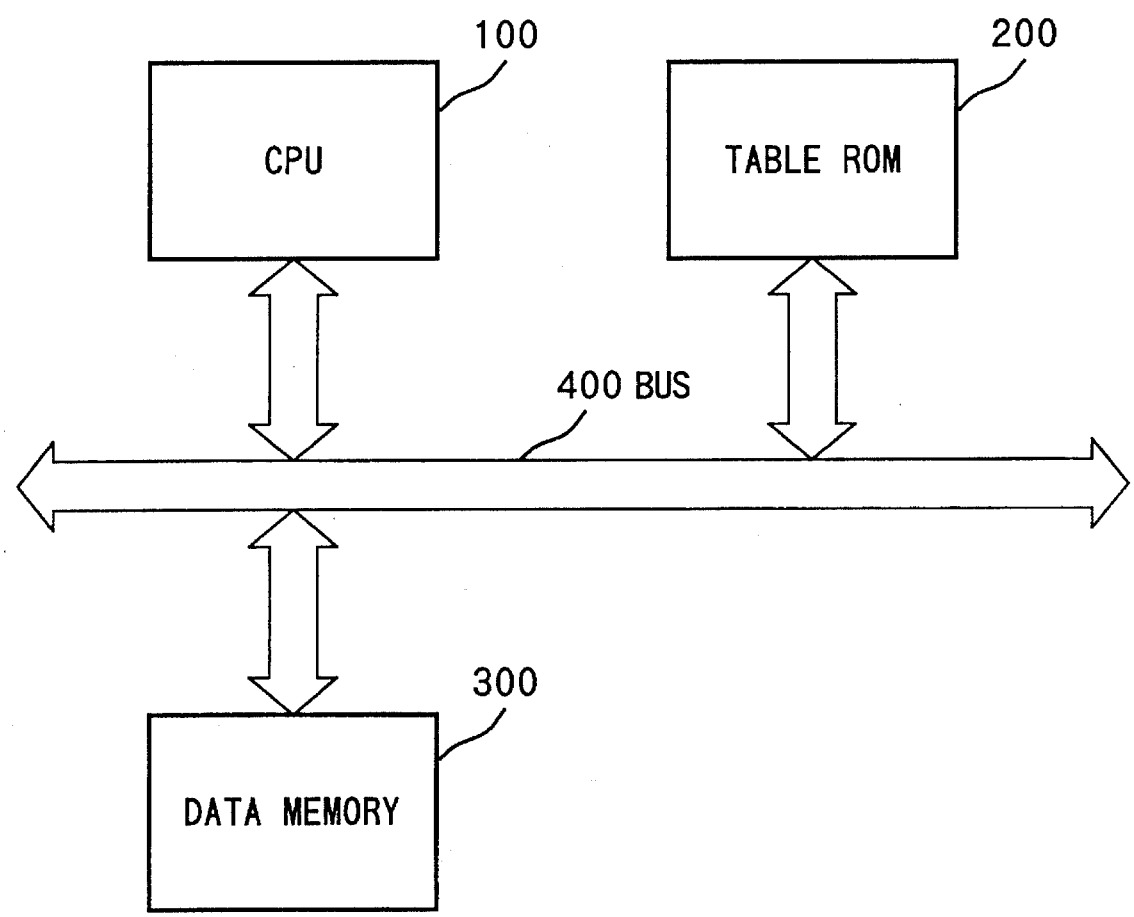
FIG. 3 is a block diagram to show the entire configuration of a cyclic coding and CRC processor according to the present invention.
Figure 6:
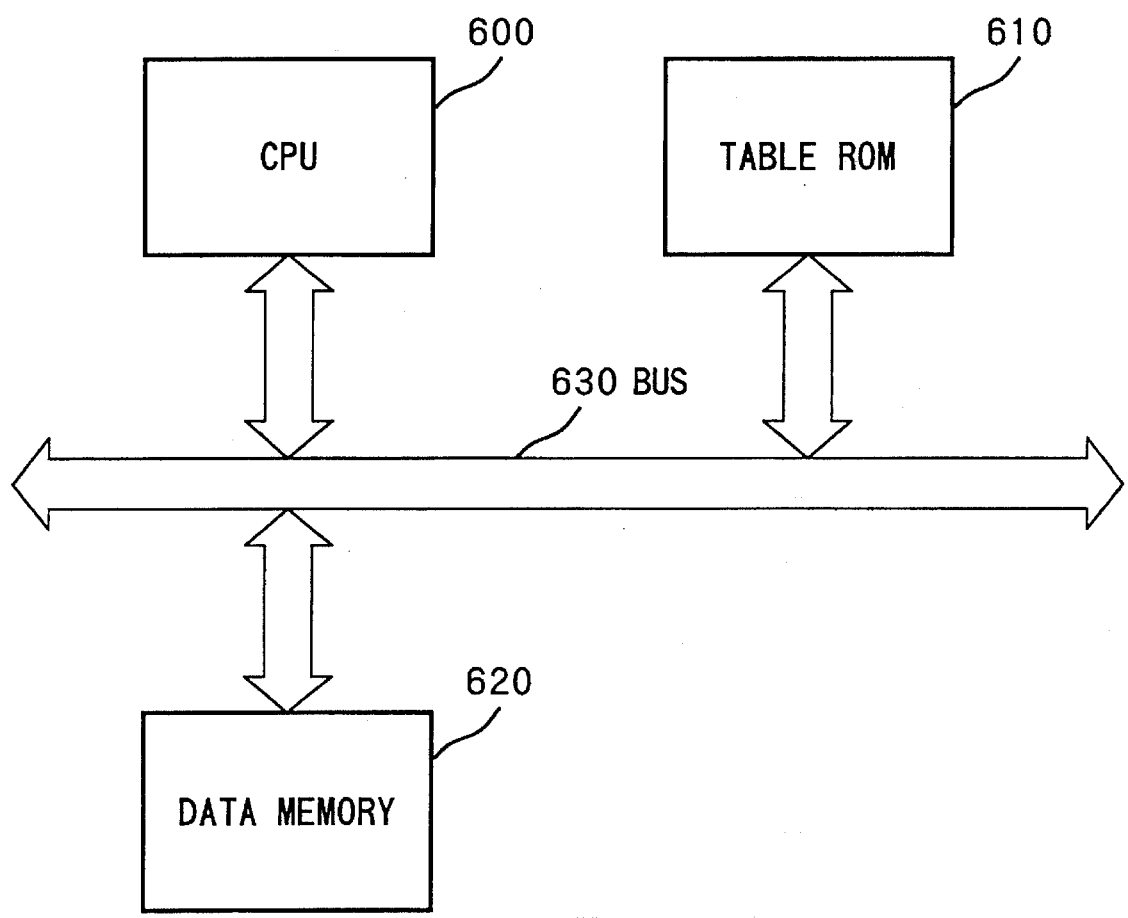
FIG. 6 is a block diagram to show the entire configuration of a conventional cyclic coding processor according to a first example.
Figure 7A:
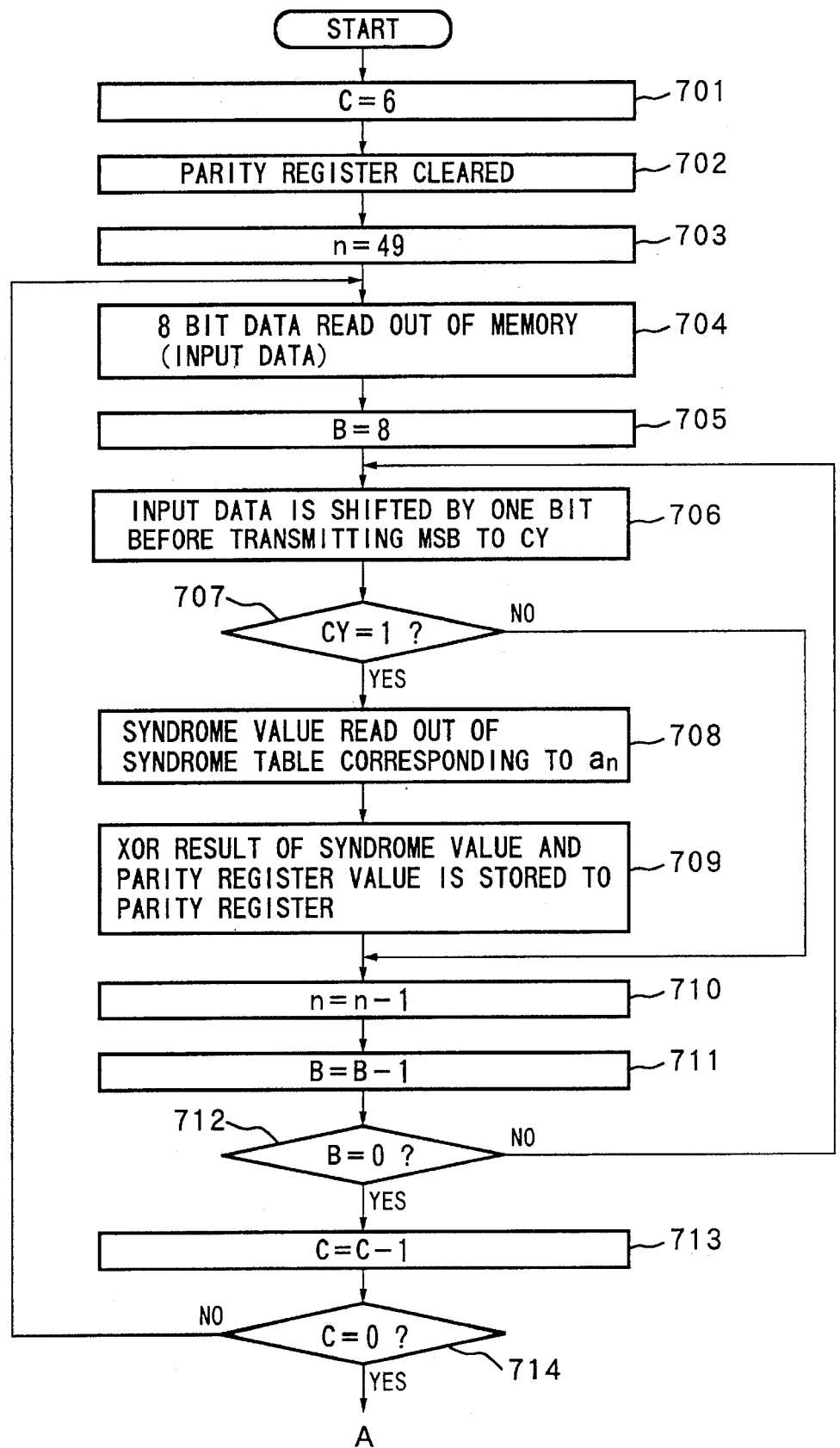
FIGS. 7A and 7B show flowcharts illustrating the flow of conventional cyclic coding.
Figure 7B:
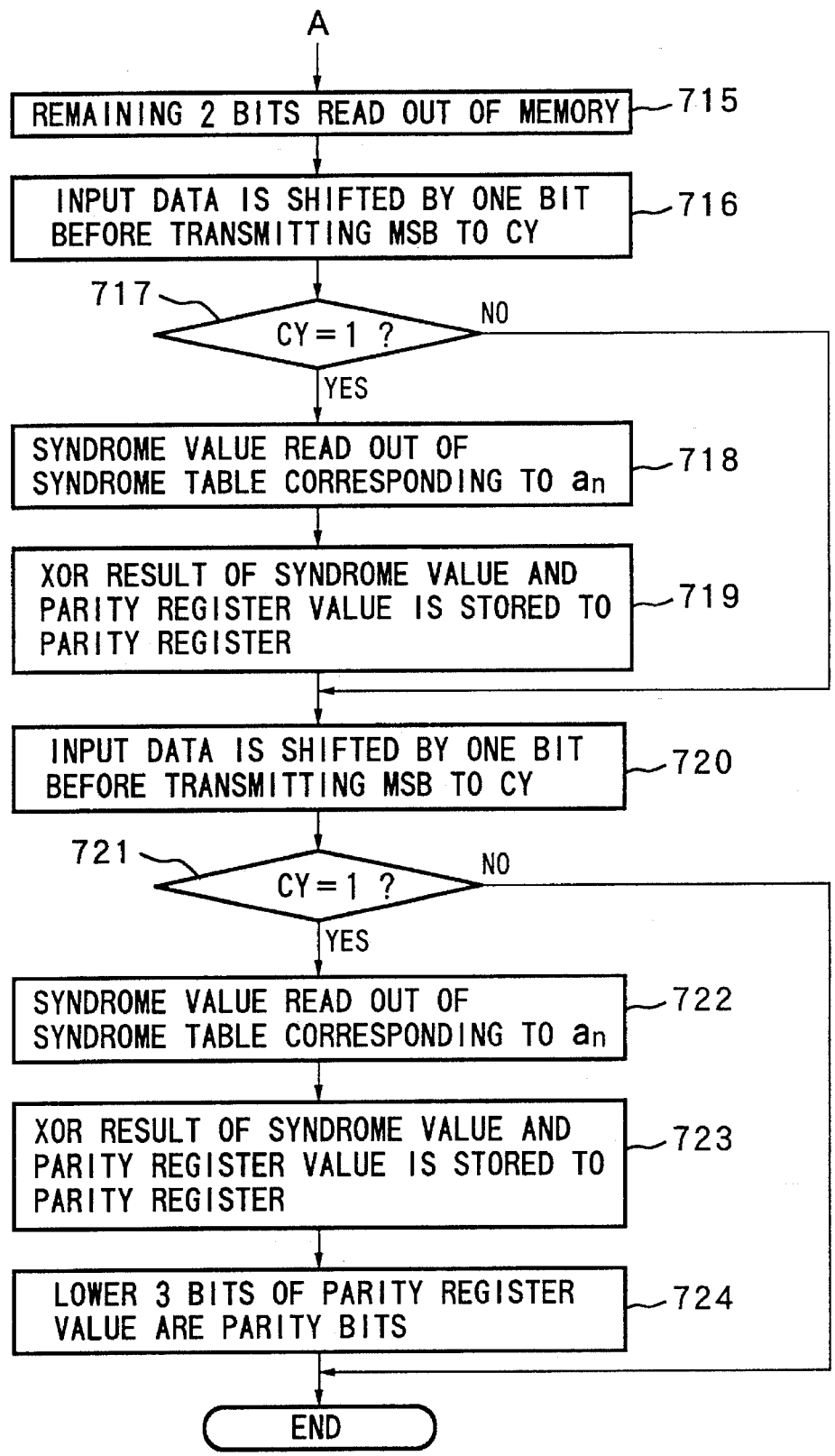
Figure 8:
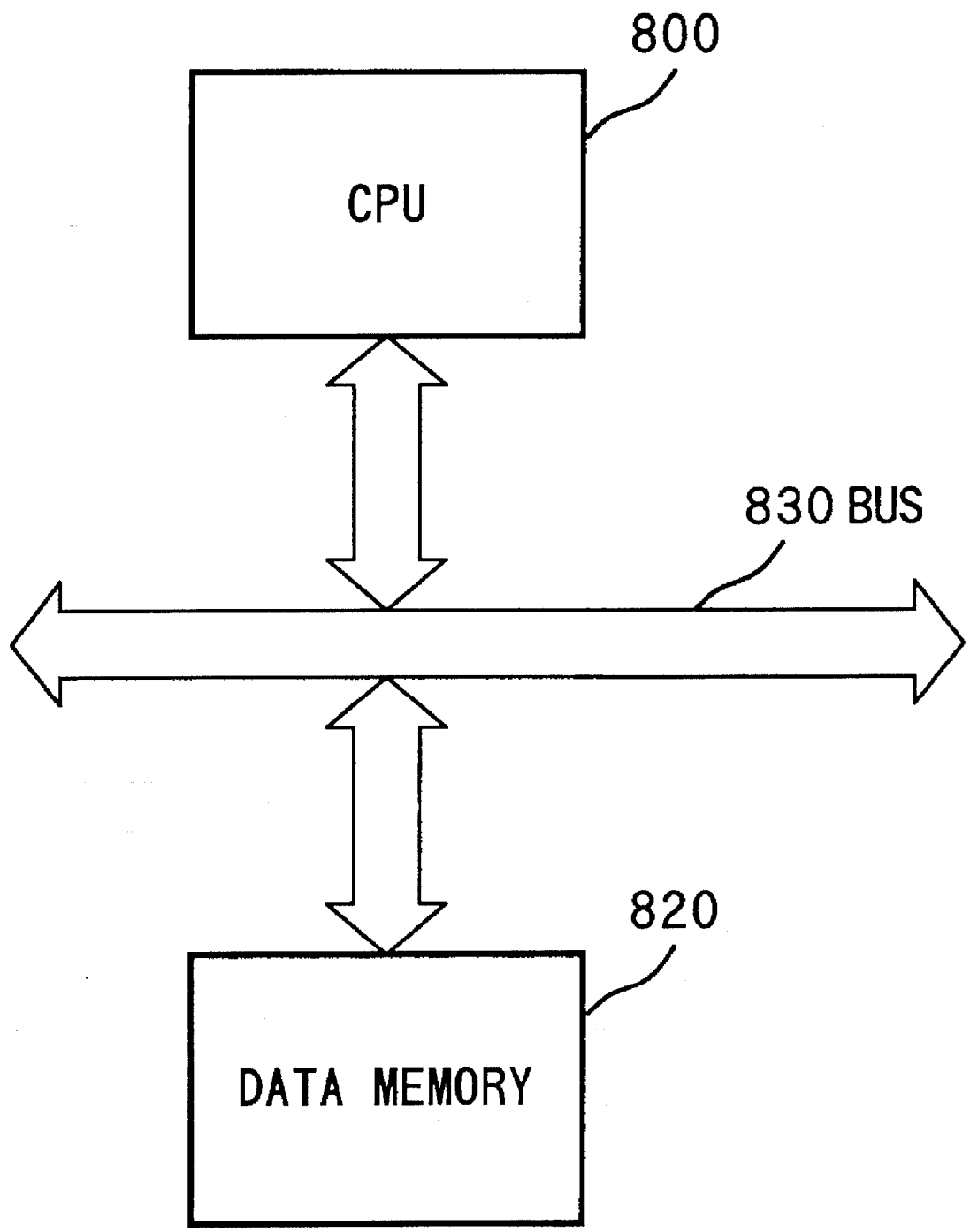
FIG. 8 is a block diagram to show the entire configuration of another conventional cyclic coding processor according to a second example.
Figure 9B:
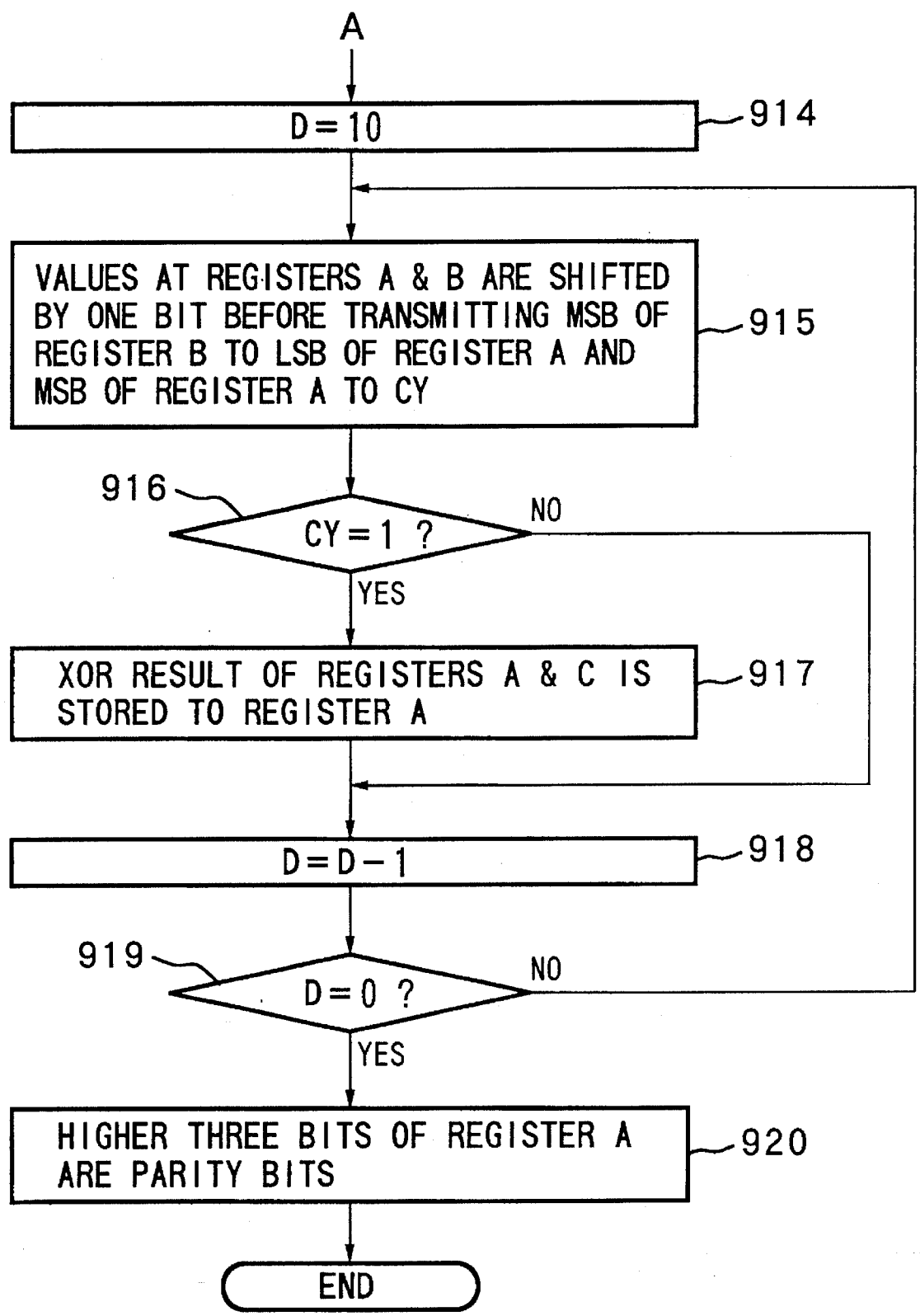

FIG. 3 shows the entire configuration of a cyclic coding and CRC processor according to the present invention. The reference numeral 100 indicates a CPU for operation, data processing and control by a unit of 8 bits. The numeral 200 indicates a table ROM to store a residue table and 300 indicates a data memory to store the data to be changed into cyclic codes. The CPU 100, the table ROM 200 and the data memory 300 are connected by a bus 400.

Figure 1:
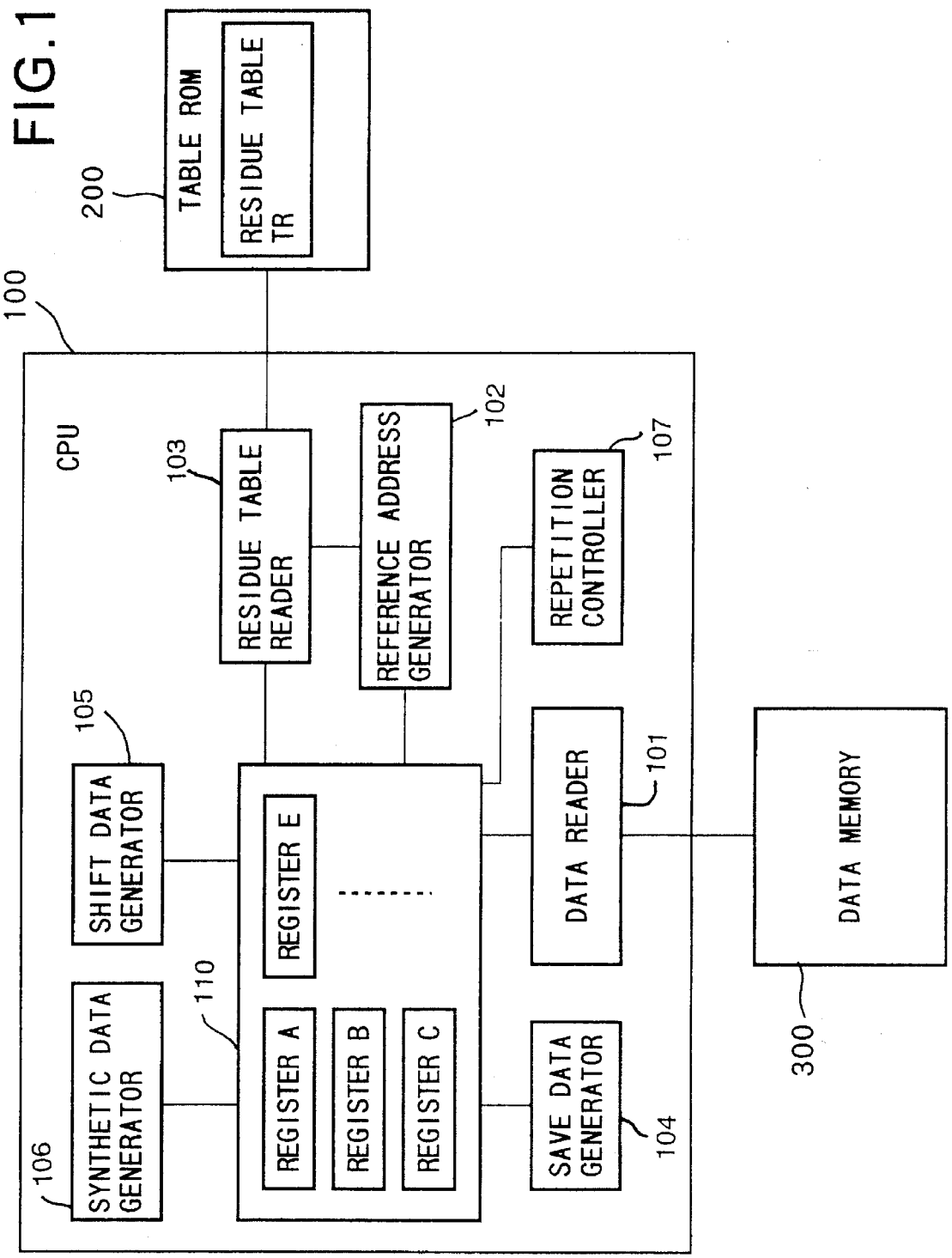
FIG. 1 is a block diagram to illustrate the configuration of a cyclic coding processor according to a first embodiment of the present invention.

FIG. 1 is a block diagram to illustrate the function of the CPU 100. In the figure, the CPU 100 comprises a data reader 101 to read out the data to be processed from the data memory 300, a reference address generator 102 to generate addresses for the residue data to be read out of the residue table TR in the table ROM 200, a residue table reader 103 to read out the residue data from the residue table TR in the table ROM 200, a save data generator 104 to save the data read out in the cyclic coding and CRC processing, a shift data generator 105 to shift the data read out in the cyclic coding and CRC processing, a synthetic data generator 106 for data synthesis in the cyclic coding and CRC processing, a repetition controller 107 to control repetition of the cyclic coding and CRC processing and registers 110 to be used for data operation in the cyclic coding and CRC processing.

Suppose here a generator polynomial $G(X)=X^3+X+1$. The data to be transformed into cyclic codes has 50 bits, which are, from the MSB, {$a_{49}$, $a_{48}$, . . . , $a_1$ and $a_0$}. These bits are stored in the data memory 300 in this order.

The table ROM 200 has a residue table TR prepared in advance. The residue table TR of the present embodiment to execute cyclic coding for every 8 bits of data has the configuration as described below.

Suppose 256 pieces of data with combination of 8 bit groups {Dk}, which are $d_0, d_1, \ldots, d_i, \ldots, d_7$ (i is an integer satisfying $0 \leq i \leq 7$ and k is an integer satisfying $0 \leq k \leq 255$). A data polynomial D(X) is obtained by applying the formula (1) to the above data {Dk} except bit $d_0$. This polynomial D(X) is subjected to division with modulo 2 by the generator polynomial G (X). To the 3 bit residue $\{r_0, r_1, r_2\}$ obtained from such division, bit $d_0$ of the data {Dk} is added so as to form a 4 bit data $\{d_0, r_0, r_1, r_2\}$.

$$D(X) = \sum_{i=1}^{7} d_i X^i \quad (1)$$

The residue table TR has 256 pieces of data $\{d_0, r_0, r_1, r_2\}$ generated for each bit in the data {Dk}. Accordingly, the residue table TR in this case has a size of 4 bits×256:256 bytes for an 8 bit unit memory. Specifically, the table ROM 200 of this embodiment, which is an 8 bit unit memory, stores the residue table TR and residues are assigned to the higher 4 bits of the 8 bit data.

Though the computer explained above executes operation, data processing and control by units of 8 bits, the description above can be applied to computers for n-bit processing in general. Suppose a generator polynomial G(X) of degree m (m is an integer satisfying $m \leq n/2$) is used in cyclic coding and cyclic redundancy code check for predetermined number of data, or in other words, data bits in the data memory 300 are read out by units of n bits for the above processing. In this case, the residue table can be defined as follows.

For $2^n$ pieces of data $\{Dk\} = \{d_0, \ldots, d_{n-1}\}$ (where i is an integer satisfying $0 \leq i \leq n-1$ and k is an integer satisfying $0 \leq k \leq 2^n$), if $n/2-m=0$, $$Da(X) = \sum_{i=n/2-m}^{n-1} d_i X^i \quad (2)$$

The residue table has $2^n$ pieces of residue data $\{r_0, \ldots, r_{m-1}\}$ each having a length of n/2 bits, which are generated by modulo 2 division of the data polynomial Da(X) (2) by the generator polynomial G(X).

If $n/2-m>0$, the residue table has $2^n$ pieces of data $\{d_0, \ldots, d_{n/2-m+1}, r_0, \ldots, r_{m-1}\}$ each having a length of n/2 bits obtained by adding the remaining data $\{d_0, \ldots, d_{n/2-m+1}\}$ of the data Dk to the m bit residue data $\{r_0, \ldots, r_{m-1}\}$ as a result of modulo 2 division of the above data polynomial Da(X) by the generator polynomial G (X).

In the above description of the present embodiment, the generator polynomial G(X) has a degree of "3" and n is 8, and it corresponds to the case where $n/2-m>0$.

Figure 2A:
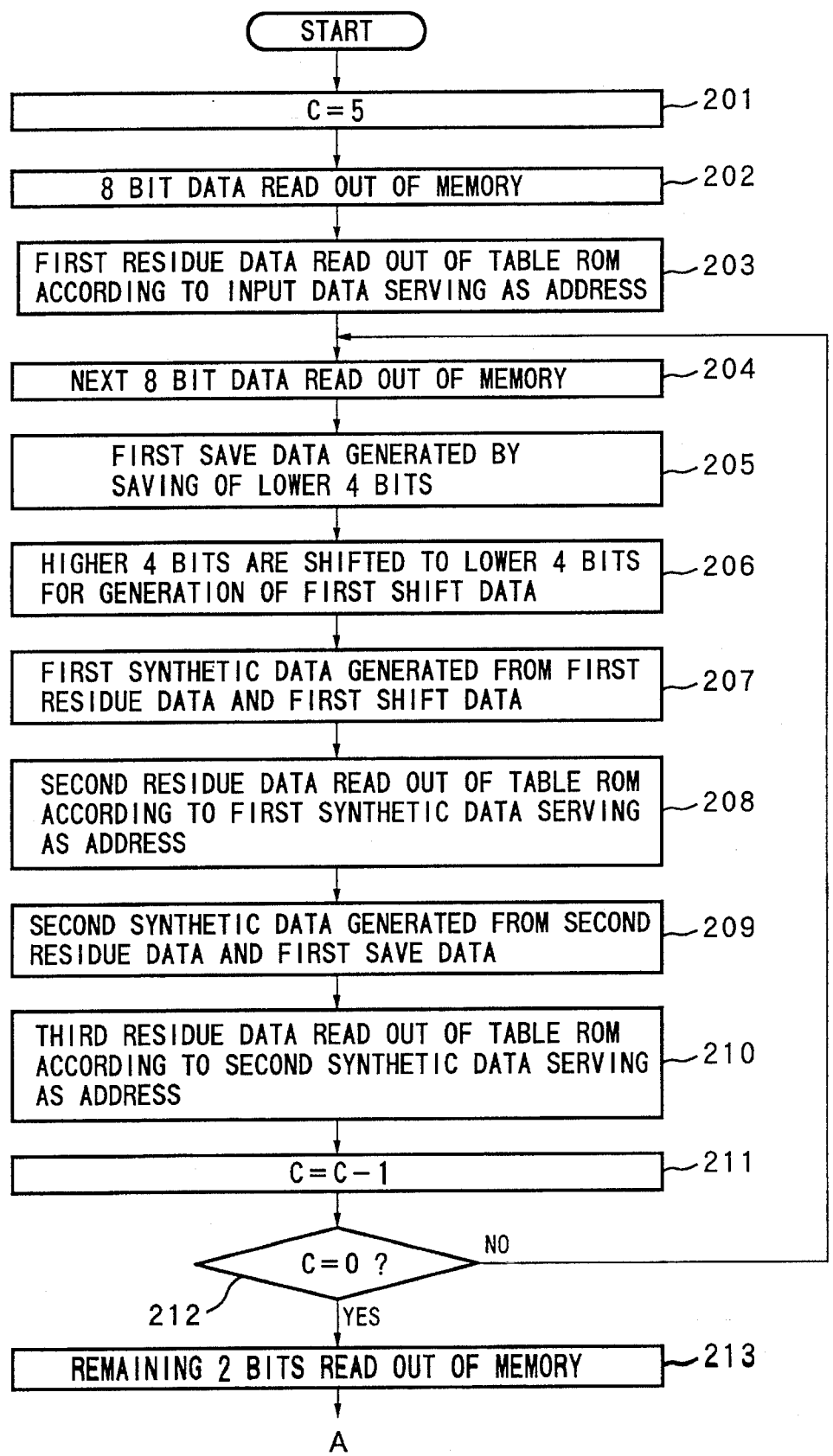
FIGS. 2A and 2B show flowcharts illustrating the flow of cyclic coding procedure according to the first embodiment.
Figure 2B:
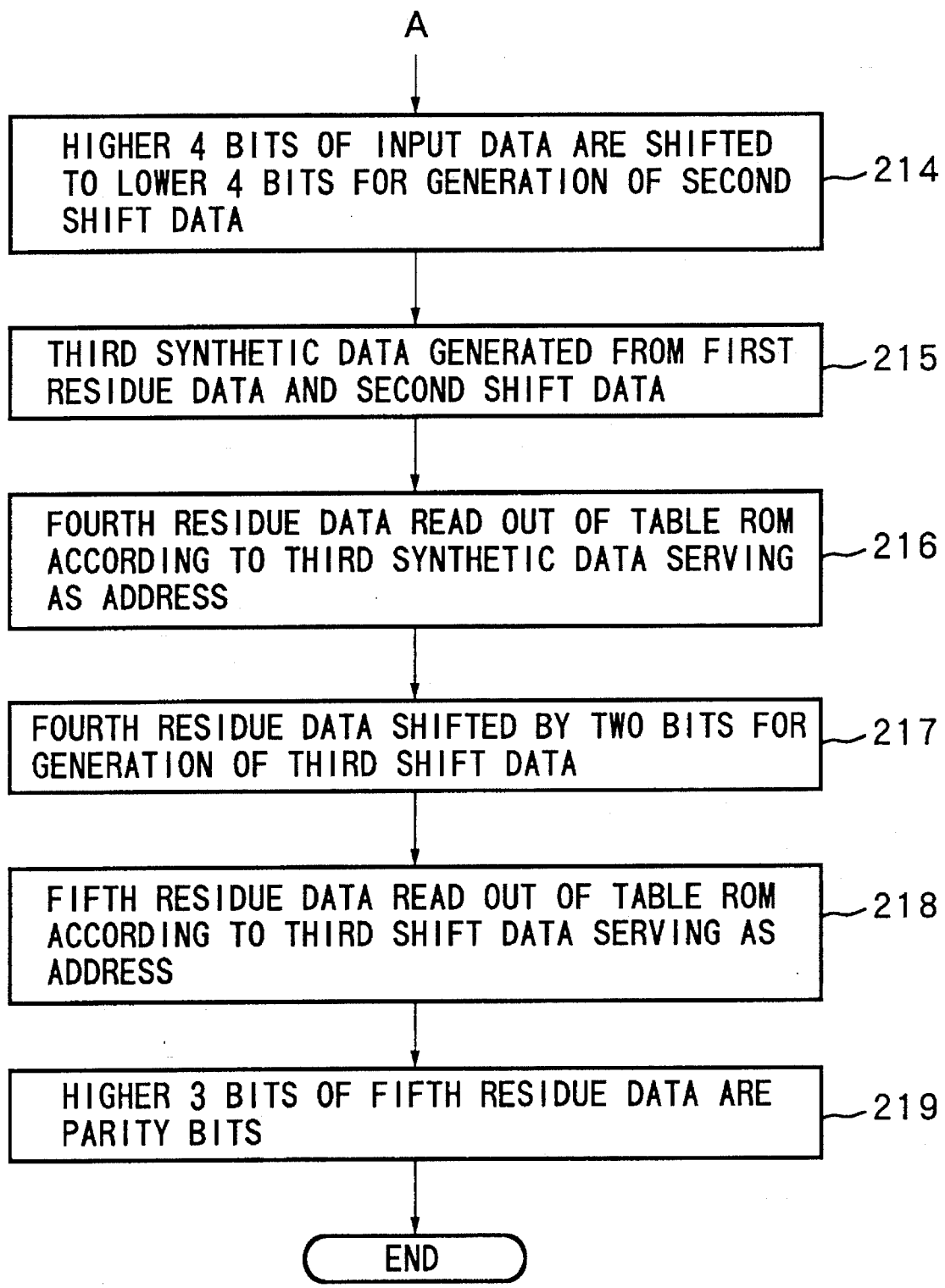

Refer now to the flowcharts of FIGS. 2A and 2B to describe cyclic coding procedure and Table 3 to show an example of coding with Z80 assembler.

Firstly, the repetition controller 107 of the CPU 100 sets the number of loops C=5 at the register (Step 201). Then, the data reader 101 reads out 8 bits from the MSB ($a_{49}$ to $a_{42}$) among 50 bits of data from the data memory 300 so that they are used as the input data (Step 202).

The reference address generator 102 of the CPU 100 uses the above input data to generate an address for the residue table. The residue table reader 103 reads out the first residue data (assigned to the higher 4 bits of the 8 bit data) corresponding to the reference address from the residue table TR and stores the data to register A (Step 203).

The data reader 101 of the CPU 100 reads out the next 8 bits ($a_n$ to $a_{n-7}$; n=41) from the data memory 300 and stores them to register E as the input data (Step 204).

The save data generator 104 saves the lower 4 bits of the input data to register B as the first save data (Step 205). Further, the shift data generator 105 of the CPU 100 shifts the higher 4 bits in register E to the lower 4 bits so as to form the first shift data (Step 206).

The synthetic data generator 106 of the CPU 100 synthesizes the first residue data of register A and the first shift data of register E by OR operation to generate the first synthetic data to be stored in register E (Step 207).

Then, the reference address generator 102 uses the first synthetic data as the reference address for the residue table TR. The residue table reader 103 reads out the second residue data from the residue table TR according to the reference address and stores the data to register A (Step 208).

Here, the synthetic data generator 106 of the CPU 100 stores the second residue data of register A to register E and stores the first save data to register A. It further ORs the second residue data and the first save data to form the second synthetic data to be stored in register E (Step 209).

Then, the reference address generator 102 uses the second synthetic data as the reference address for the residue table TR. The residue table reader 103 reads out the third residue data from the residue table TR according to the reference address and stores the data to register A (Step 210).

Focusing on the data read out of the data memory 300 in the above procedure, it is understood that the operation is made by units of 4 bits.

After reading of the third residue data in Step 210, the repetition controller 107 decrements the number of loops C (Step 211), and it checks whether the number of loops C is "0" or not in Step 212. If the number of loops C is "0" or more, the CPU 100 returns to Step 204 so that the data reader 101 of the CPU 100 further reads out the following 8 bits ($a_n$ to $a_{n-7}$; n=33) from the data memory 300 and performs the procedure of Steps 205 to 210 for the input data newly read out.

The CPU 100 continues the above procedure by units of 4 bits for the number of loops (or until the number of loops C becomes "0"). By repeating the procedure of Steps 204 to 210 until the number of loops C becomes "0", 48 bits among 50 bits are processed.

If the number of loops C is found to be "0" in Step 212, then the CPU 100 has its data reader 101 read out the remaining 2 bits of the data among 50 bits from the data memory 300 and store them to register E (Step 213). Among 8 bits stored in register E, the higher two bits are provided with the bits read out of the above data memory 300. In other words, an input data having valid bits at the higher 2 bits among 8 bits is stored.

Next, the shift data generator 105 shifts the higher 4 bits of the input data to the lower 4 bits so as to generate the second shift data (Step 214). The lower two bits of the second shift data is provided with "0". In other words, among the lower 4 bits in an 8 bit data, the higher 2 bits are provided with the 2 bit data read out of the above data memory 300 and the lower 2 bits are provided with "0".

Then, the synthetic data generator 106 of the CPU 100 synthesizes the third residue data of register A and the second shift data of register E by OR operation to generate the third synthetic data to be stored in register E (Step 215).

The reference address generator 102 uses the third synthetic data as a reference address for the residue address TR. According to such reference address, the residue table reader 103 reads out the fourth residue data from the residue table TR to be stored in register A (Step 216).

The shift data generator 105 of the CPU 100 shifts the fourth residue data by two bits toward lower bit direction and thereby obtains the third shift data (Step 217). Here, the higher 2 bits and the lower 2 bits of the third shift data have "0".

Then, the reference address generator 102 uses the third shift data as the reference address for the residue table TR and the residue table reader 103, according to such reference address, reads out the fifth residue data from the residue table TR (Step 218). The higher 3 bits of the fifth residue data are the desired parity bits (Step 219).

The number of execution states determined from the coding example of Table 3 is found to be 651 states.

FIG. 4 shows the configuration of a CRC processor according to a second embodiment of the present invention. This processor has a CPU 100a with the same configuration as the CPU 100 of FIG. 1 except addition of a parity checker 120 to check the parity to judge whether the data has any error or not.

According to the second embodiment, CRC processing is described below. The cyclic coding and CRC processing basically follow the same procedure. Usually, the data transmitter transmits the data in cyclic codes (information bits+parity bits) and the receiver performs CRC processing (error detection with parity check). In the description below,

[TABLE 3]

```
******
Cyclic coding (parity generation) -- 4 bit operation
method
        Generator polynomial: G(X) = X³ + X + 1
        data : D[49]-D[0] (50 bits)
******
        LD      HL, DATA        ;HL: Input data address
        LD      DE, ARITHTBL    ;DE: Operation table address
        LD      C, 5            ;C: Number of loops
        LD      E, (HL)         ;E: Input data
        LD      A, (DE)         ;A: 4 bit operation result
LOOP1:
        INC     L               ;HL: Next input data address
        LD      E, (HL)         ;E: Input data
        LD      B, E            ;B: Lower 4 bits saving
        SRL     E
        SRL     E
        SRL     E
        SRL     E               ;E: Higher 4 bits shifted
                                 to lower 4 bits
        OR      E               ;A: Synthesis of operation result
                                 and input data
        LD      E, A
        LD      A, (DE)         ;A: 4 bit operation result
        LD      E, A            ;E: 4 bit operation result saving
        LD      A, B
        AND     0FH             ;A: Input data for remaining
                                 lower 4 bits
        OR      E               ;A: Synthesis of operation result
and
                                 input data
        LD      E, A
        LD      A, (DE)         ;A: 4 bit operation result
        DEC     C
        JP      NZ,LOOP1
        INC     L               ;HL: Next input data address
        LD      E, (HL)         ;E: Input data
                                 (Higher 2 bits are valid)
        SRL     E
        SRL     E
        SRL     E
        SRL     E               ;E: Higher 4 bits shifted to
                                 lower 4 bits
        OR      E               ;A: Synthesis of operation result
                                 and input data
        AND     0FCH            ;A: Lower 2 bits cleared
        LD      E, A
        LD      A, (DE)         ;A: 4 bit operation result
                                 (with input of one bit having "0")
        RRA
        RRA                     ;A: 2 bit shifting to the right
                                 (arranged for two bits having "0")
        LD      A, (DE)         ;Parity bit operation result
; Arithmetic table
ARITHTBL:
        DB      00H operation result
        DB      01H operation result
        .
        .
        .
        DB      FFH operation result
```

CRC processing for the data in cyclic codes according to the first embodiment.

Referring now to the flowcharts of FIGS. 5A and 5B to illustrate the CRC processing, 53 bits of data to be subjected to the CRC processing are supposed to be stored in the data memory 300 in appropriate order. These 53 bits comprise 50 bits of cyclic coded data and three parity bits. Prior to execution of the processing, a residue table TR similar to the one described for the first embodiment is prepared in advance and stored in the table ROM 200.

In Steps 501 to 510, the same procedure as the one in Steps 201 to 210 of FIG. 2A is performed and explanation therefor is omitted. The data of 53 bits has 50 information bits and three parity bits. Therefore, upon completion of processing in Step 512 (upon completion of data processing for 48 bit data), there remains 5 bits of data. Specifically, the remaining two information bits and three parity bits.

Referring first to Step 513, is the number of loops C is "0" in Step 512, the data reader 101 of the CPU 100 reads out the remaining five bits in 53 bit data from the data memory 300 and stores them to register E as input data (Step 513). The eight bits are provided with bit numbers from the higher bits in descending order so that the MSB has the bit number 7 and the LSB has the bit number 0 among the eight bits. In other words, among the eight bits of the input data, the higher five bits are provided with the data read out of the data memory 300 (the higher five bits are valid).

Then, the save data generator 104 saves the third bit in the input data (Bit 3) and treats it as the second save data (Step 514). In this second save data, the third bit in the eight bits (Bit 3) is valid.

Next, the shift data generator 105 of the CPU 100 shifts the higher four bits of the input data to the lower four bits and treats it as the second shift data (Step 515). Then, the synthetic data generator 106 of the CPU 100 synthesizes the third residue data and the second shift data by means of logical OR operation to generate the third synthetic data (Step 516).

The reference address generator 102 generates third synthetic data as the reference address of the residue table TR and the residue table reader 103 reads out the fourth residue data from the residue table TR according to the reference address (Step 517).

Then, the synthetic data generator 106 of the CPU 100 synthesizes the fourth residue data and the second save data by means of logical OR operation to generate the fourth synthetic data (Step 518). Then, the shift data generator 105 shifts the fourth synthetic data by two bits to the lower bit direction so as to generate the third shift data (Step 519). At this time the higher two bits of the third shift data are set to "0".

Then, the reference address generator 102 of the CPU 100 generates the third shift data as the reference address of the residue table TR and the residue table reader 103 reads out the fifth residue data from the residue table TR according to the reference address (Step 520). Then, the parity checker 120 checks the higher three bits of the read out fifth residue data (Step 521). If the higher three bits of the fifth residue data are all "0", the system judges that the 53 bit data has no error, and judges that there is an error when even one of the higher three bits is "0".

As described above, the cyclic coding and CRC processing device according to the above embodiments enables shifting and data synthesis for every n/2 bits because it stores a residue table of $2^n$ pieces in advance. This reduces the time required for cyclic coding and CRC processing, so that the computer can be effectively utilized for other processing including communication protocol control. Reduction of the time required for cyclic coding and CRC processing also eliminates the need of high speed computers, which reduces the cost of the system.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. A cyclic coding processor for a generator polynomial G(X) of degree m (m is an integer satisfying $m \leq n/2$) using a computer for data processing by units of n bits comprising:

residue table storage means for storing a residue table containing $2^n$ pieces of residue data (each piece having n/2 bits) obtained by divisions of $2^n$ pieces of data each piece having n bits) by said generator polynomial;

data read means for reading out said data having n bits for cyclic coding;

address generation means for generating addresses of said residue data to be read out from said residue table storage means;

residue data read means for reading said residue data out of said residue table storage means according to the generated addresses;

data save means for saving the data for said cyclic coding, said data save means generating save data by saving the lower n/2 bits of the data for said cyclic coding;

data shift means for shifting the data for said cyclic coding, said data shift means generating the shift data by shifting the higher n/2 bits of the data for said cyclic coding toward the lower n/2 bits; and data synthesis means for synthesizing said shifted and saved data and said residue data read out, said data synthesis means generating synthetic data by synthesizing said residue data with one of said shift data and said save data.

2. A cyclic coding processor as set forth in claim 1 wherein said address generation means uses, for a first address generation, n bit data for said cyclic coding read out by said data read means in order to generate said first address for said residue table, and for each of the following address generations, the data obtained by synthesis of the residue data having n/2 bits previously read out and n/2 bits of the n bit data for said cyclic coding in order to generate said each of the following address for said residue table.

3. A cyclic coding processor as set forth in claim 2 wherein the data obtained by synthesis includes the residue data of n/2 bits previously read out as the higher bits and the n/2 bits of the n bit data for said cyclic coding as the lower bits.

4. A cyclic coding processor as set forth in claim 1 wherein said residue table has $2^n$ pieces of residue data each having a length of n/2 bits obtained by modulo 2 divisions with said generator polynomial G (X) of the data polynomials $$Da(X) = \sum_{i=n/2-m}^{n-1} d_i X^i$$

for $2^n$ pieces of data with groups of n bits $\{Dk\}$ ($Dk=(d_0, \ldots, d_i, \ldots d_{n-1})$) where di is 0 or 1, i is an integer satisfying $0 \leq i \leq n-1$ and k is an integer satisfying $0 \leq k \leq 2^n$.

5. A cyclic coding processor as set forth in claim 4 wherein said residue table has, if n/2−m=0, $2^n$ pieces of residue data $\{r_0, \ldots, r_{m-1}\}$, each having a length of n/2 bits, obtained by modulo 2 divisions with said generator polynomial G(X) of the data polynomials $$Da(X) = \sum_{i=n/2-m}^{n-1} d_i X^i$$

for said data $\{Dk\}$ and, if n/2−m>0, n/2 bit data comprising $2^n$ pieces of m bit residue data $\{r_0, \ldots, r_{m-1}\}$ obtained by modulo 2 divisions with said generator polynomial G(X) of said data polynomials and the remaining n/2−m bit data of said data $\{Dk\}$, which are $\{d_0, \ldots, d_{n/2-m+1}\}$.

6. A cyclic redundancy check processor for a generator polynomial G(X) of degree m (m is an integer satisfying m≧n/2) using a computer for data processing by units of n bits comprising:

residue table storage means for storing a residue table containing $2^n$ pieces of residue data having n/2 bits obtained by division of $2^n$ pieces of data having n bits by said generator polynomial;

data read means for reading out said data having n bits for cyclic redundancy check;

address generation means for generating addresses of said residue data to be read out from said residue table storage means;

residue data read means for reading said residue data out of said residue table storage means according to the generated addresses, data save means for saving the data for said cyclic redundancy check, said data save means generating save data by saving the lower n/2 bits of the data for said cyclic redundancy check;

data shift means which shifts the data for said cyclic redundancy check, said data shift means generating the shift data by shifting the higher n/2 bits of the data for said cyclic redundancy check toward the lower n/2 bits;

data synthesis means for synthesizing said shifted and saved data and said residue data read out, said data synthesis means generating synthetic data by synthesizing said reside data with one of said shift data and said save data; and check means for parity check of the data for said cyclic redundancy checking using said residue data finally read out.

7. A cyclic redundancy check processor as set forth in claim 6 wherein said address generation means uses, for a first address generation, n bit data for said cyclic redundancy check read out by said data read means in order to generate said first address for said residue table, and for each of the following address generations, the data obtained by synthesis of the residue data having n/2 bits previously read out and n/2 bits of the n bit data for said cyclic redundancy check in order to generate said each of the following address for said residue table.

8. A cyclic redundancy check processor as set forth in claim 7 wherein the data obtained by synthesis includes the residue data of n/2 bits previously read out as the higher bits and the n/2 bits of the n bit data for said cyclic redundancy check as the lower bits.

9. A cyclic redundancy check processor as set forth in claim 6 wherein said residue table has $2^n$ pieces of residue data each having a length of n/2 bits obtained by modulo 2 divisions with said generator polynomial G (X) of the data polynomials $$Da(X) = \sum_{i=n/2-m}^{n-1} d_i X^i$$

for $2^n$ pieces of data with groups of n bits $\{Dk\}$ ($Dk=(d_0, \ldots, d_i, \ldots, d_{n-1})$) where di is 0 or 1, i is an integer satisfying $0 \leq i \leq n-1$ and k is an integer satisfying $0 \leq k \leq 2^n$.

10. A cyclic redundancy check processor as set forth in claim 9 wherein said residue table has, if n/2−m=0, $2^n$ pieces of residue data $\{r_0, \ldots, r_{m-1}\}$, each having a length of n/2 bits, obtained by modulo 2 divisions with said generator polynomial G(X) of the data polynomials $$Da(X) = \sum_{i=n/2-m}^{n-1} d_i X^i$$

for said data $\{Dk\}$ and, if n/2−m>0, n/2 bit data comprising $2^n$ pieces of m bit residue data $\{r_0, \ldots, r_{m-1}\}$ obtained by modulo 2 divisions with said generator polynomial G(X) of said data polynomials and the remaining n/2−m bit data of said data $\{Dk\}$, which are $\{d_0, \ldots, d_{n/2-m+1}\}$.

11. A cyclic coding processor for a generator polynomial G(X) of degree m (m is an integer satisfying m≧n/2) using a computer for data processing by units of n bits comprising:

residue table storage means for storing a residue table containing $2^n$ pieces of residue data having n/2 bits obtained by divisions of $2^n$ pieces of data having n bits by said generator polynomial;

data read means for reading out the data having n bits for cyclic coding;

address generation means for generating addresses of said residue data to be read out from said residue table storage means;

residue data read means for reading said residue data out of said residue table storage means according to the generated addresses;

data save means for saving the data for said cyclic coding, said data save means generating save data by saving the lower n/2 bits of the data for said cyclic coding;

data shift means for shifting the data for said cyclic coding, said data shift means generates the shift data by shifting the higher n/2 bits of the data for said cyclic coding toward the lower n/2 bits; and data synthesis means for synthesizing said shifted and saved data and said residue data read out, said data synthesis means generating synthetic data by synthesizing said residue data with one of said shift data and said save data, wherein said address generation means uses, for a first address generation, n bit data for said cyclic coding read out by said data read means in order to generate said first address for said residue table, and for each the following address generations, the data obtained by synthesis of the residue data having n/2 bits previously read out and n/2 bits of the n bit data for said cyclic coding in order to generate said each of the following address for said residue table.

\* \* \* \* \*